US009870969B2

(12) United States Patent
Lee et al.

(10) Patent No.: US 9,870,969 B2
(45) Date of Patent: Jan. 16, 2018

(54) SUBSTRATE

(71) Applicant: Advanced Micro Devices (Shanghai) Co., Ltd., Shanghai (CN)

(72) Inventors: I-Tseng Lee, Kaohsiung (TW); Yu-Ling Hsieh, New Taipei (TW)

(73) Assignee: ADVANCED MICRO DEVICES (SHANGHAI) CO., LTD., Shanghai (CN)

( * ) Notice: Subject to any disclaimer, the term of this patent is extended or adjusted under 35 U.S.C. 154(b) by 154 days.

(21) Appl. No.: 14/193,462

(22) Filed: Feb. 28, 2014

(65) Prior Publication Data

US 2014/0246223 A1 Sep. 4, 2014

(30) Foreign Application Priority Data

Mar. 1, 2013 (CN) .......................... 2013 1 0066146

(51) Int. Cl.
| | |
|---|---|
| *H05K 1/02* | (2006.01) |
| *H01L 23/13* | (2006.01) |
| *H05K 3/00* | (2006.01) |
| *H05K 1/03* | (2006.01) |
| *H05K 3/34* | (2006.01) |

(52) U.S. Cl.
CPC .............. *H01L 23/13* (2013.01); *H05K 1/024* (2013.01); *H05K 1/036* (2013.01); *H05K 3/0052* (2013.01); *H05K 3/0061* (2013.01); *H01L 2224/16225* (2013.01); *H01L 2924/0002* (2013.01); *H01L 2924/01078* (2013.01); *H05K 3/3452* (2013.01); *H05K 2201/0209* (2013.01); *H05K 2201/0959* (2013.01); *H05K 2201/10674* (2013.01)

(58) Field of Classification Search
CPC ........... H01L 23/13; H01L 2224/16225; H01L 2224/32225; H01L 2224/73204; H05K 2201/0209; H05K 2201/0959; H05K 2201/09045

See application file for complete search history.

(56) References Cited

U.S. PATENT DOCUMENTS

| | | | | |
|---|---|---|---|---|
| 4,020,535 | A * | 5/1977 | Cuneo | .................. H05K 3/0002 445/49 |
| 2004/0012934 | A1* | 1/2004 | Jafari | ...................... G06F 1/183 361/760 |
| 2008/0305306 | A1* | 12/2008 | Yu | .......................... H01L 23/13 428/172 |
| 2010/0132982 | A1* | 6/2010 | Cho | ................. H01L 23/49827 174/252 |

(Continued)

FOREIGN PATENT DOCUMENTS

| | | | | |
|---|---|---|---|---|
| JP | 2003-218279 | * | 7/2003 | ............. H01L 23/12 |
| WO | WO 2014045491 A1 | * | 3/2014 | ............... G03F 7/20 |

*Primary Examiner* — Ishwarbhai B Patel
*Assistant Examiner* — Paresh Paghadal
(74) *Attorney, Agent, or Firm* — Volpe and Koenig, P.C.

(57) ABSTRACT

The present invention relates to a substrate comprising a build-up and a solder resist layer disposed on the build-up. The solder resist layer has an upper surface facing away from the build-up. The solder resist layer has a plurality of grooves on its upper surface. The grooves of the solder resist layer can better eliminate or relieve the stress accumulated on large solder resist area induced by heat and/or material coefficient of thermal expansion mismatch of the substrate and thus can prevent and diminish warpage of the substrate or package.

4 Claims, 4 Drawing Sheets

(56) References Cited

U.S. PATENT DOCUMENTS

2011/0057330 A1\* 3/2011 Ushiyama ............. H01L 21/565
 257/779
2015/0208501 A1\* 7/2015 Hayashi ................ G03F 7/2024
 174/251

\* cited by examiner

SUBSTRATE

CROSS REFERENCE TO RELATED APPLICATION

This application claims priority to Chinese Patent Application No. 201310066146.1, filed Mar. 2, 2013, which is incorporated by reference as if fully set forth herein.

TECHNICAL FIELD OF THE INVENTION

The present invention relates generally to semiconductor technology including flip chip technologies. More specifically, the present invention relates to a substrate, in particular a stress relief pattern on solder resist layer of a substrate.

BACKGROUND

In the die packaging technical field, a substrate is used for a die to be assembled thereon. A substrate usually comprises a build-up and a solder resist layer disposed on the build-up. The existing pattern of solder resist layer on a build-up of a substrate is a form of continuous flat plate. FIG. 1 shows an existing substrate 100 in which the pattern of the solder resist layer 101 on build-up 102 is a continuous flat plate. However, this kind of solder resist pattern layer has the several shortcomings. For example, thermal expansion mismatch between the die and substrate materials induces high stress, and the continuous flat plate type pattern of solder resist layer is not beneficial to reduce the stress accumulated on large solder resist area and relieve the stress induced by material coefficient of thermal expansion (CTE) mismatch of the substrate, which causes it to be easier to render warpage of the substrate or package. In addition, this pattern of the solder resist layer in the existing art is not beneficial to reduce die crack risk induced by die-substrate CTE mismatch.

Therefore, it is desirable to provide an improved stress relief pattern of substrate solder resist to eliminate or relieve the above shortcomings in existing art.

SUMMARY

To overcome the shortcomings in the existing art, the present invention provides a substrate having an improved pattern on substrate solder resist with better performance.

Specifically, some embodiments of the present invention provide a substrate which comprises a build-up and a solder resist layer disposed on the build-up. The solder resist layer has an upper surface facing away from the build-up. The solder resist layer has a plurality of grooves on its upper surface.

In some embodiments, the plurality of grooves is parallel with each other.

In certain further embodiments, the plurality of parallel grooves can have a plurality of extending directions.

In certain further embodiments, the plurality of grooves comprise a first groove set including a plurality of parallel first grooves and a second groove set including a plurality of parallel second grooves, wherein the plurality of parallel first grooves intersect with the plurality of parallel second grooves.

In certain further embodiments, the intersecting angle between the plurality of parallel first grooves and the plurality of parallel second grooves can be any angle from 0° to 90°. Preferably, the intersecting angle is 90°.

In certain further embodiments, the plurality of grooves is defined by a plurality of solder resist paths, wherein the solder resist path between every two adjacent grooves is continuous.

In certain further embodiments, the plurality of grooves is defined by a plurality of solder resist paths, wherein the solder resist path between adjacent two grooves is discontinuous.

In certain further embodiments, the discontinuous solder resist path comprises a plurality of cylindrical solder resist bumps spaced from each other.

In certain further embodiments, the discontinuous solder resist path comprises a plurality of prismatic solder resist bumps spaced from each other.

In certain further embodiments, the discontinuous solder resist path comprises a plurality of cubic solder resist bumps spaced from each other.

In certain further embodiments, the discontinuous solder resist path comprises a plurality of cylindrical, cubic and/or prismatic solder resist bumps spaced from each other.

By providing the above-mentioned substrate, the present invention overcomes the above mentioned shortcomings in the existing substrate.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Exemplary embodiments will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention. In addition, in the detailed description of the embodiments, directional terminology, such as "top," "bottom," "front," "rear," "side," "left," "right," "forward," "trailing," etc., is used with reference to the orientation of the Figure(s) being described. Because components of embodiments of present invention can be positioned in a number of different orientations, the directional terminology is used for purposes of illustration and is in no way limiting.

Figure 1:
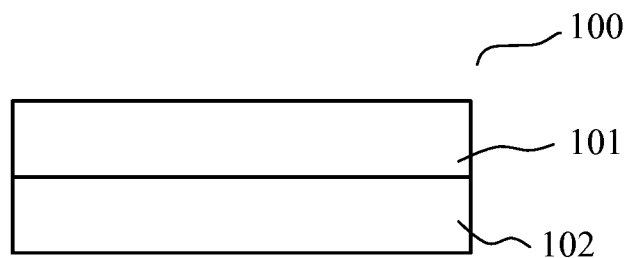
FIG. 1 depicts a side schematic view of solder resist pattern in existing substrate.
Figure 2:
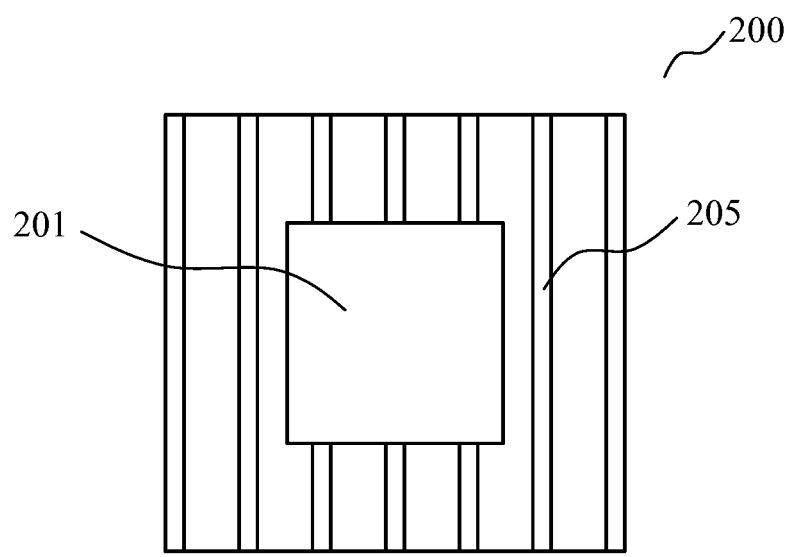
FIG. 2 depicts a top schematic view of a substrate according to one explanatory embodiment.
Figure 3:
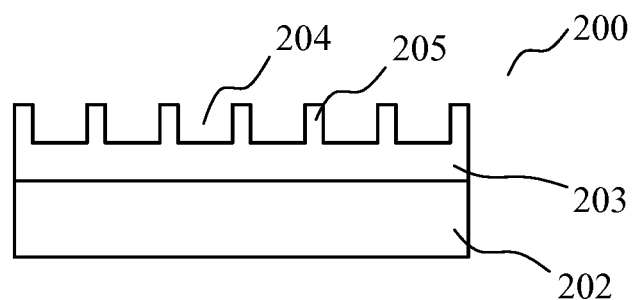
FIG. 3 depicts a side schematic view of the substrate shown in FIG. 2.
Figure 4:
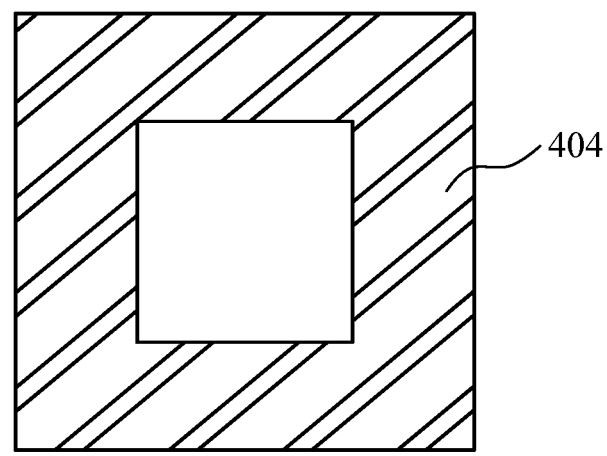
FIG. 4 depicts a top schematic view of a substrate according to another explanatory embodiment.

Referring to FIGS. 2-3, there is shown a top schematic view and a side schematic view of a substrate 200 according to one explanatory embodiment. As shown in FIGS. 2-3, the substrate 200 comprises a build-up 202 and a solder resist layer 203. A C4 area 201 of the substrate 200 is used to assemble die. The solder resist layer 203 is disposed on the build-up 202 and has an upper surface facing away from the build-up. The solder resist layer 203 has a plurality of grooves 204 on its upper surface. The plurality of grooves 204 are defined by a plurality of solder resist path 205. That is to say, between every two adjacent grooves there is a solder resist path 205. In FIGS. 2-3, the plurality of grooves 204 are parallel with each other; however, this is not essential and the plurality of grooves 204 also may not be parallel with each other. In addition, the extending direction of the plurality of parallel grooves 204 can be any directions. For example, FIG. 4 shows another embodiment of the plurality of parallel grooves 404 having different extending direction from that in FIG. 3.

Figure 5:
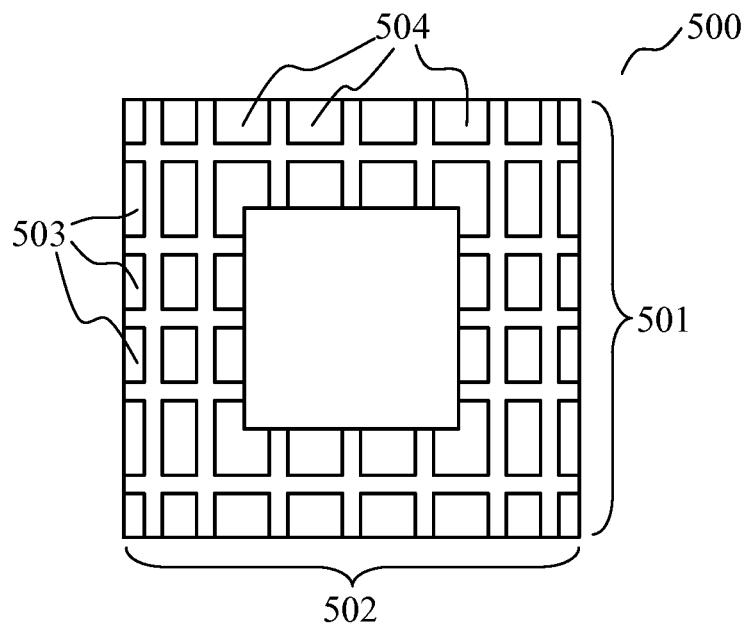
FIG. 5 depicts a top schematic view of a substrate according to another explanatory embodiment.

Referring to FIG. 5, there is shown a top schematic view of a substrate 500 according to another explanatory embodiment. As shown in FIG. 5, there are two groove sets on the upper surface of the solder resist layer, namely a first groove set 501 and a second groove set 502. The first groove set 501 includes a plurality of parallel first grooves 503. The second groove set 502 includes a plurality of parallel second grooves 504. The plurality of parallel first grooves 503 intersect with the plurality of parallel second grooves 504. The intersecting angle between the plurality of parallel first grooves 503 and the plurality of parallel second grooves 504 shown in FIG. 5 is 90°. However, the intersecting angle can be any angle from 0°-90°.

Figure 6:
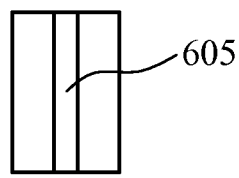
FIG. 6 depicts a partial enlarged schematic view of an explanatory embodiment of the solder resist path shown in FIGS. 2-5.
Figure 7:
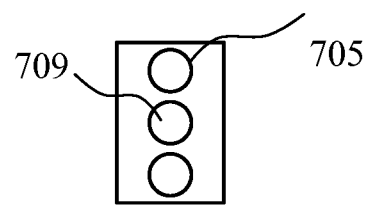
FIG. 7 depicts a partial enlarged schematic view of another explanatory embodiment of the solder resist path shown in FIGS. 2-5.
Figure 8:
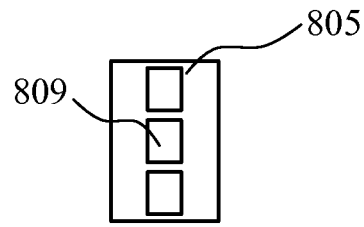
FIG. 8 depicts a partial enlarged schematic view of another explanatory embodiment of the solder resist path shown in FIGS. 2-5.
Figure 9:
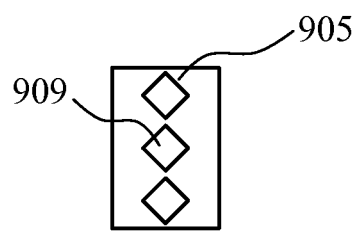
FIG. 9 depicts a partial enlarged schematic view of another explanatory embodiment of the solder resist path shown in FIGS. 2-5.
Figure 10:
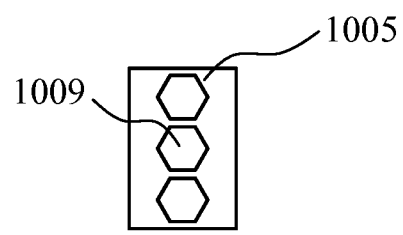
FIG. 10 depicts a partial enlarged schematic view of another explanatory embodiment of the solder resist path shown in FIGS. 2-5.

Referring to FIGS. 6-10, there are shown partial enlarged views of the explanatory embodiments of the solder resist paths shown in FIGS. 2-5. In FIG. 6, the solder resist path 605 is continuous. In FIGS. 7-10, the solder resist paths 705, 805,905 and 1005 are discontinuous. Specifically, the solder resist path 705 in FIG. 7 comprises a plurality of cylindrical solder resist bumps 709 spaced from each other. The solder resist path 805 in FIG. 8 comprises a plurality of cubic solder resist bumps 809 spaced from each other. The solder resist path 905 in FIG. 9 and the solder resist path 1005 in FIG. 10 comprise respectively a plurality of prismatic solder resist bumps 909,1009 spaced from each other, wherein the number of the side of the prismatic solder resist bump 909 is four and the number of the side of the prismatic solder resist bump 1009 is five. Of course, the prismatic solder resist bump 909 or 1009 can have other number of side.

In the substrate as described above, because there are a plurality of grooves on the upper surface of the solder resist, it can better eliminate or relieve the stress accumulated on large solder resist area induced by heat and/or material coefficient of thermal expansion mismatch of the substrate and thus can prevent and diminish warpage of the substrate or package. In addition, the substrate of present invention also can have reduced die crack risk induced by die-substrate CTE mismatch.

It will be apparent to those skilled in the art that various modifications and variations can be made to the embodiments described herein without departing from the spirit and scope of the claimed subject matter. Thus, it is intended that the specification cover the modifications and variations of the various embodiments described herein, provided such modification and variations come within the scope of the appended claims and their equivalents.

What is claimed is:

1. A substrate, comprising:
   a build-up layer; and
   a solder resist layer disposed on the build-up layer and extending a width between opposing first edges in a first direction and a length between opposing second edges in a second direction different from the first direction, each of the opposing first and second edges extending from a top to a bottom of the solder resist layer, the solder resist layer comprising:
   an upper surface facing away from the build-up layer, and
   a plurality of grooves disposed on the upper surface of the solder resist layer,
   wherein the upper surface of the solder resist layer includes a plurality of upper surface portions, each upper surface portion extending in the first direction between two adjacent grooves of the plurality of grooves and at least two upper surface portions extending continuously in the second direction from one opposing second edge to another opposing second edge, each upper surface portion extending a first distance between the two adjacent grooves in the first direction, the first distance being less than: (i) a second distance that a first adjacent groove of the two adjacent grooves extends in the first direction; and (ii) a third distance that a second adjacent groove of the two adjacent grooves extends in the first direction.

2. The substrate of claim 1, wherein the plurality of grooves are parallel with each other.

3. The substrate of claim 1, wherein the grooves are defined by solder resist paths, wherein the solder resist path between the two adjacent grooves is continuous.

4. The substrate of claim 1, wherein each of the plurality of grooves extend continuously in the second direction from the one opposing second edge to the other opposing second edge of the solder resist layer.

* * * * *